(12) United States Patent
Okajima et al.

(10) Patent No.: US 7,173,219 B2
(45) Date of Patent: Feb. 6, 2007

(54) CERAMIC HEATERS

(75) Inventors: Hisakazu Okajima, Nishikasugai-Gun (JP); Mitsuru Ohta, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/998,392

(22) Filed: Nov. 29, 2004

(65) Prior Publication Data
US 2005/0173410 A1 Aug. 11, 2005

(30) Foreign Application Priority Data
Dec. 1, 2003 (JP) ............................ P2003-401616

(51) Int. Cl.
*H05B 3/68* (2006.01)
*C23C 16/00* (2006.01)

(52) U.S. Cl. ..................... 219/444.1; 118/725

(58) Field of Classification Search ............. 219/443.1, 219/444.1, 446.1, 448.11, 448.12, 465.1, 219/466.1, 468.1, 543, 544, 548; 118/724, 118/725
See application file for complete search history.

(56) References Cited

U.S. PATENT DOCUMENTS

| | | | | |
|---|---|---|---|---|
| 4,394,564 A * | 7/1983 | Dills | ...................... | 219/448.17 |
| 5,059,770 A * | 10/1991 | Mahawili | ..................... | 219/391 |
| 6,035,101 A * | 3/2000 | Sajoto et al. | ............... | 392/416 |
| 6,204,488 B1 * | 3/2001 | Toya et al. | .................. | 219/541 |
| 6,392,205 B1 * | 5/2002 | Minonishi | ................ | 219/443.1 |
| 6,465,763 B1 * | 10/2002 | Ito et al. | ................... | 219/444.1 |
| 6,507,006 B1 * | 1/2003 | Hiramatsu et al. | ....... | 219/444.1 |
| 6,635,853 B2 * | 10/2003 | Saito et al. | .............. | 219/465.1 |
| 6,639,189 B2 * | 10/2003 | Ramanan et al. | ........ | 219/444.1 |
| 6,677,557 B2 * | 1/2004 | Ito et al. | ................... | 219/465.1 |
| 6,891,263 B2 * | 5/2005 | Hiramatsu et al. | .......... | 257/703 |
| 2003/0183616 A1 | 10/2003 | Goto | | |

FOREIGN PATENT DOCUMENTS

| | | |
|---|---|---|
| JP | 2001-52843 A | 2/2001 |
| JP | 2004-6242 A | 1/2004 |

* cited by examiner

*Primary Examiner*—Sang Y. Paik
(74) *Attorney, Agent, or Firm*—Burr & Brown

(57) ABSTRACT

An object of the present invention is to provide a heater having a ceramic substrate with a through hole formed therein so that the uniformity of temperature on the heating face of the substrate can be improved and the use life of the ceramic substrate can be improved upon thermal cycles. A ceramic heater comprises a substrate made of a ceramic material and having a heating face where three or more zones 3C, 3F are allocated, heating resistances corresponding to the zones, respectively, and terminals 5C electrically connected to the heating resistances, respectively. Three or more holes 4 are formed in the substrate. Distances of the terminals 5C and the wall surfaces facing the holes 4 are 8 mm or more, respectively. The heating resistance 15 intersects a straight line 16 connecting the center of the terminal and the center 4a of the hole in a plan view.

6 Claims, 5 Drawing Sheets

CERAMIC HEATERS

This application claims the benefit of Japanese Patent Application P2003-401616 filed on Dec. 1, 2003, the entirety of which is incorporated by reference.

BACKGROUND OF THE INVENTION

1. Field of the Invention

The invention relates to a ceramic heater suitable for heating semiconductors or the like.

2. Related Art Statement

In a system for producing semiconductors, a ceramic heater is applied for heating a wafer so as to deposit a semiconductor thin film on the wafer from gaseous raw materials such as silane gas by means of thermal CVD or the like. In such ceramic heaters, it is required to make the temperature of the heating face and the semiconductor wafer mounted thereon uniform at a high precision.

Several techniques for reducing temperature distribution on the heating (mounting) face of the ceramic heater are known. For example, a so-called two-zone heater is known as such a technique. Such a two-zone heater has a ceramic substrate and inner and outer resistance heat generators made of a metal having a high melting point embedded in the substrate. Separate power supply terminals are connected to the respective heat generators so that electric power may be applied independently on the respective generators. Heat generated from the inner and outer heat generators can be thus independently controlled.

Japanese patent publication 2001-52,843A discloses a heater having a ceramic substrate having nine zone heating resistances embedded therein, and a through hole is formed in the substrate.

When a ceramic heater is used as a susceptor for mounting a semiconductor, various kinds of holes may be provided in the substrate of the heater. Such holes include holes for inserting lift pins for lifting a semiconductor, a gas supply hole for supplying back side gas and a hole for inserting a thermocouple. Such holes, especially through holes, formed in the ceramic substrate result in structural defects.

According to the ceramic heater disclosed in Japanese patent publication 2001-52,843A, the distances between terminals and through holes in the second and third zones viewed from the center are very small. Such a design of terminals and through holes results in cold spots in regions surrounding the terminal and through holes, which deteriorate the temperature uniformity. Further, such cold spot results in a large temperature difference between the region surrounding the terminal and hole and the other region. The ceramic substrate may become susceptible to fracture, due to the temperature difference, which shortens the use life when the heater is repeatedly used.

SUMMARY OF THE INVENTION

An object of the present invention is to provide a heater having a ceramic substrate with a through hole formed therein so that the temperature uniformity on the heating face of the substrate can be improved and the use life of the ceramic substrate can be improved upon thermal cycles.

The present invention provides a ceramic heater comprising a substrate made of a ceramic material and having a heating face where three or more zones are allocated, resistance heaters corresponding to the zones, respectively, and terminals electrically connected to the resistance heaters. Three or more through holes are formed in the substrate so that distances between the terminals and the wall surfaces defining the holes are at least 8 mm, respectively, and the heating resistance intersects a straight line connecting the center of the terminal and the center of the hole in a plan view.

According to the present invention, the distance between the terminal and the wall surface defining the through hole is designed to be 8 mm or more. It is further designed that the heating resistance intersects a straight line connecting the center of the terminal and the center of the through hole in plan view. It is thus possible to prevent cold and hot spots on the heating face to improve the temperature uniformity and to improve the use life of the ceramic substrate upon thermal cycles.

BRIEF DESCRIPTION OF THE DRAWINGS

The objects, features and advantages of the present invention will be appreciated upon reading the following description of the invention when taken in conjunction with the attached drawings, with the understanding that some modifications, variations and changes of the same could be made by the skilled person in the art.

DETAILED DESCRIPTION OF THE INVENTION

The present invention will be described further in detail, referring to the attached drawings.

Figure 1:
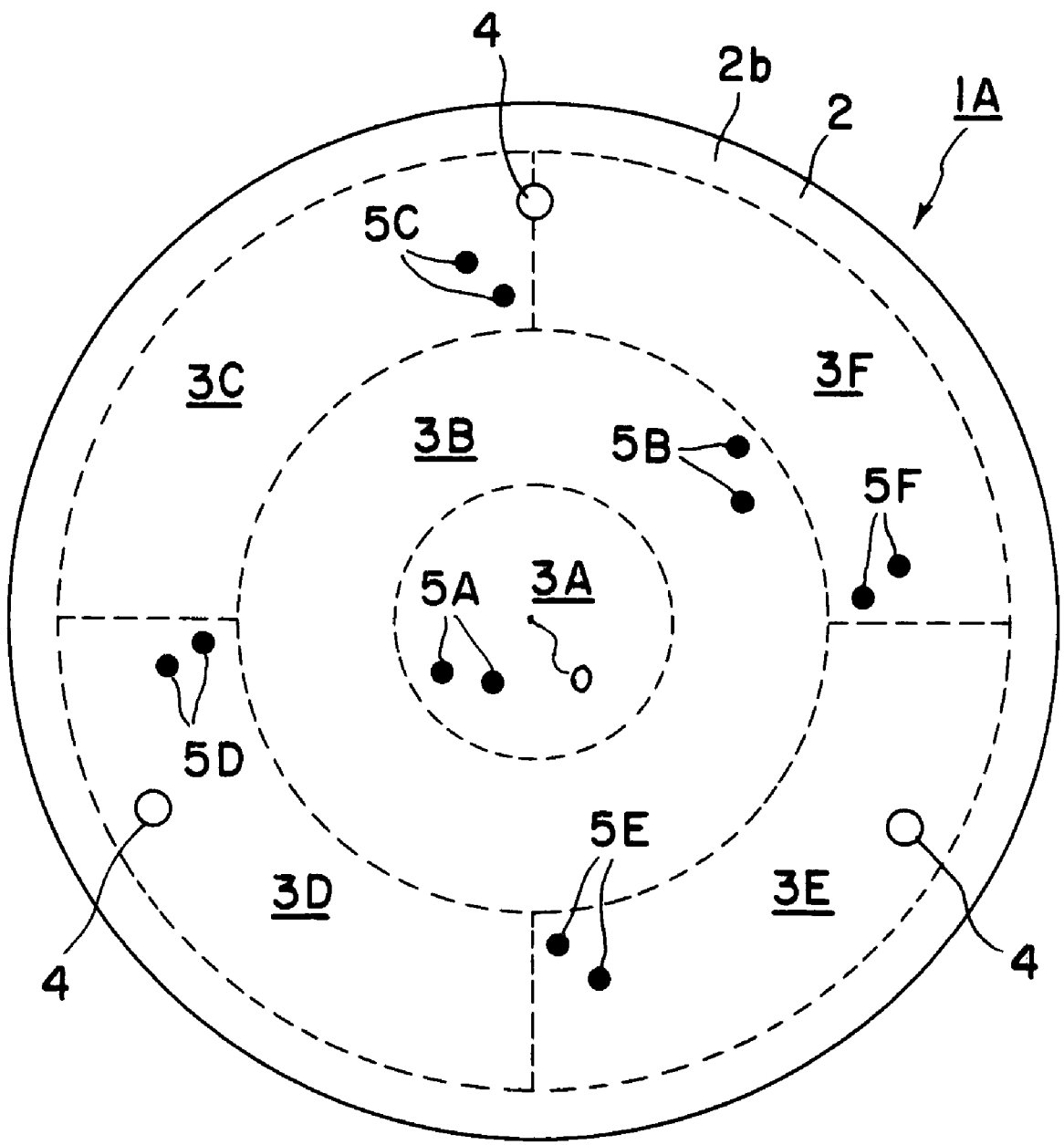
FIG. 1 is a diagram showing a planar pattern of zones 3A to 3F, through holes 4 and terminals 5A to 5F in a heater 1A according to an embodiment of the present invention.
Figure 2:
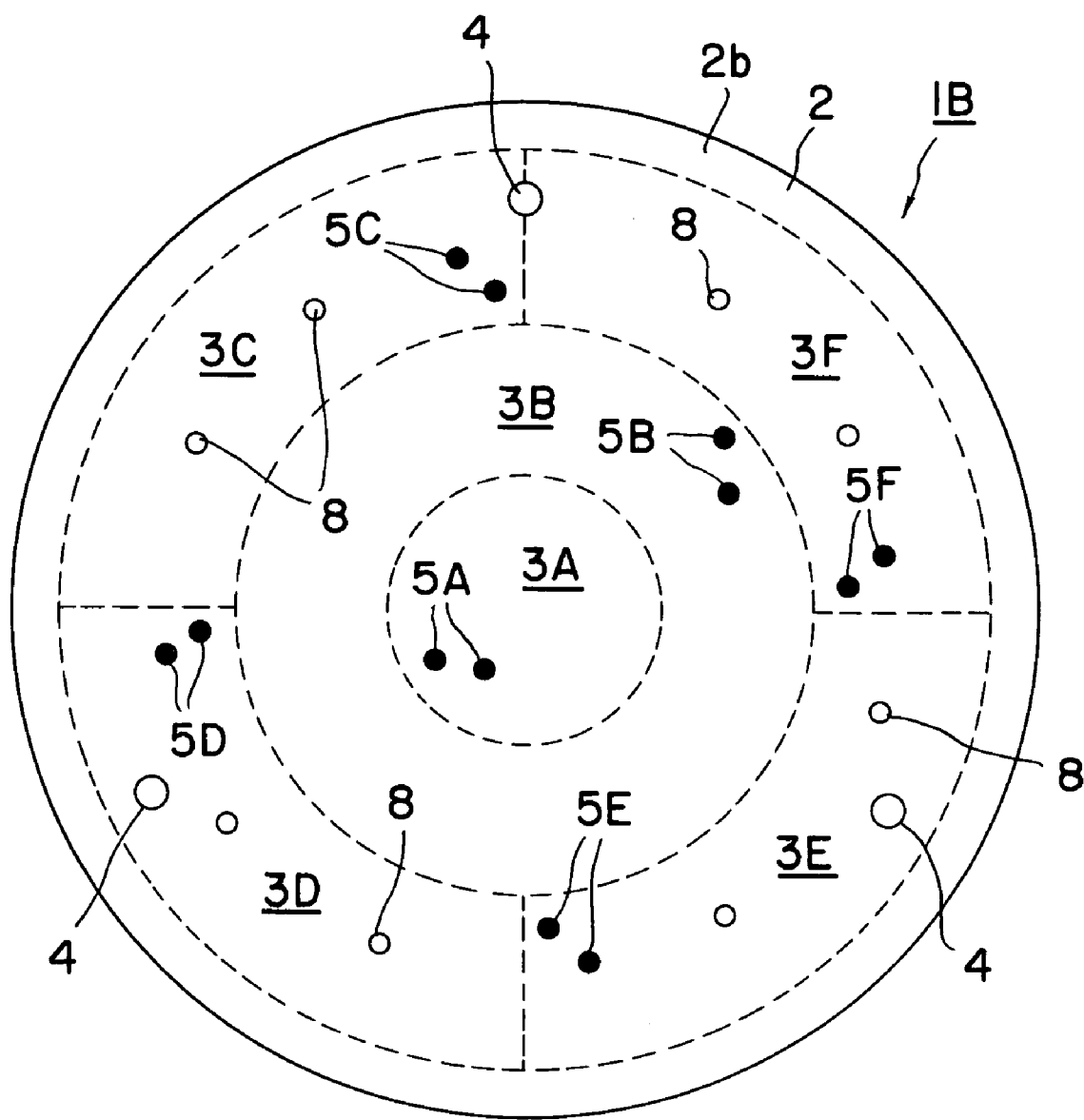
FIG. 2 is a diagram showing a planar pattern of zones 3A to 3F, through holes 4, terminals 5A to 5F and a hole 8 for a temperature measuring device in a heater 1B according to an embodiment of the present invention.
Figure 3:
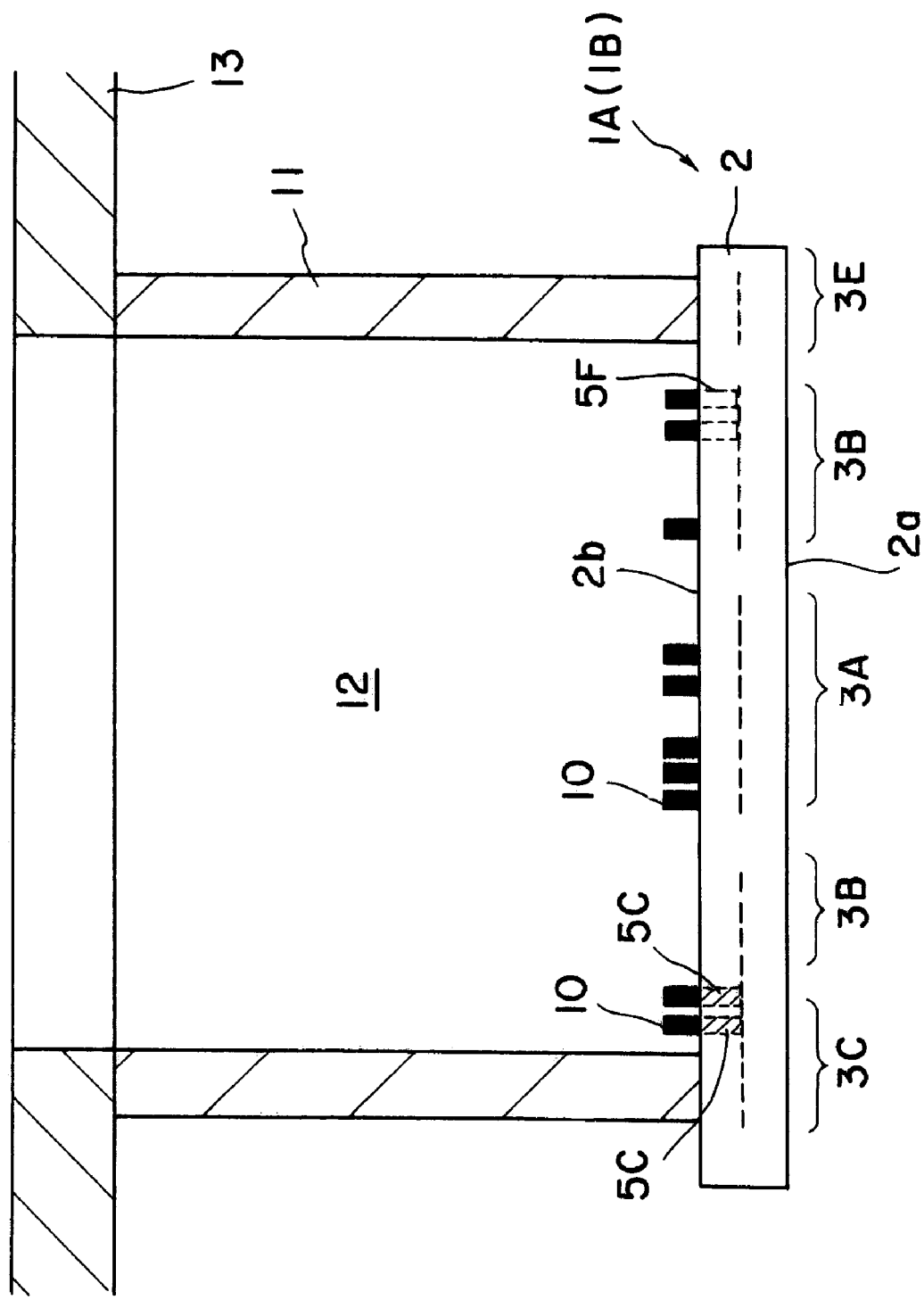
FIG. 3 is a cross sectional view schematically showing the relationship between the positions of the resistance heaters, terminals and a supporting member 11 in a heater 1A (1B).

FIG. 1 is a plan view showing a pattern of zones, through holes and terminals in a ceramic heater 1A according to an embodiment of the present invention. FIG. 2 is a plan view showing a pattern of zones, through holes, terminals and holes for inserting thermocouple in a ceramic heater 1B according to an embodiment of the present invention. FIG. 3 is a cross sectional view schematically showing a planar pattern of resistance heaters and terminals in the heater shown in FIGS. 1 and 2.

According to the examples of FIGS. 1 and 2, a substrate 2 is substantially disk shaped. A plurality of zones for embedding heating resistances, for example six zones 3A, 3B, 3C, 3D, 3E and 3F for embedding resistance heaters, are allocated in the heating face of the substrate 2. According to the present examples, the zone 3A is located in the central region of the substrate 2 and is round shaped. The zone 3B is ring shaped. The zones 3C, 3D, 3E and 3F are provided outside of the zone 3B and together form a ring surrounding the zone 3B. The zones 3C, 3D, 3E and 3F are positioned centrosymmetrical with respect to the center "O" of the zone 3A.

Resistance heaters are embedded in the zones, respectively, in which the calorific energies can be independently controlled. The resistance heaters in the zones 3A, 3B, 3C, 3D, 3E and 3F are connected to terminals 5A, 5B, 5C, 5D, 5E and 5F, respectively. Each of the terminals 5A, 5B, 5C, 5D, 5E and 5F is connected to power supply member 10 provided outside of the substrate, as shown in FIG. 3. The power supply member 10 is connected to an outer power source through an electrical cable or rod not shown. A tubular supporting member 11 is fixed onto the back face 2b of the substrate 2. The terminals, power supply member 10, electrical cable and rod face an inner space 12 inside of the supporting member 11. The method of joining the substrate 2 and supporting member 11 is not particularly limited. The joining may be carried out by soldering, fixing with bolts, or solid phase welding as described in Japanese patent publication P8-73280A. Further, the heater and supporting member may be joined and sealed using a sealing member such as an o-ring or metal packing. The supporting member 11 is equipped in a chamber 13. A numeral 4 represents a through hole for inserting a lift pin or a hole for supplying back side gas.

Figure 4:
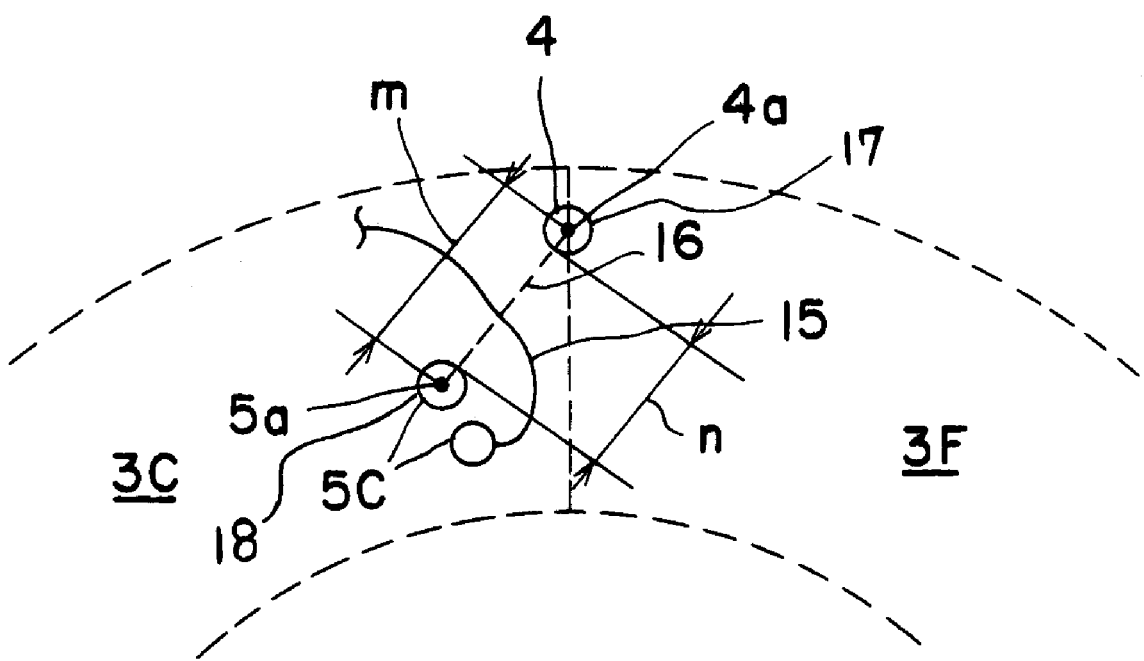
FIG. 4 is a diagram showing the relationship between the planar positions of the through holes 4, terminals 5C and the resistance heaters 15 according to the present invention.
Figure 5:
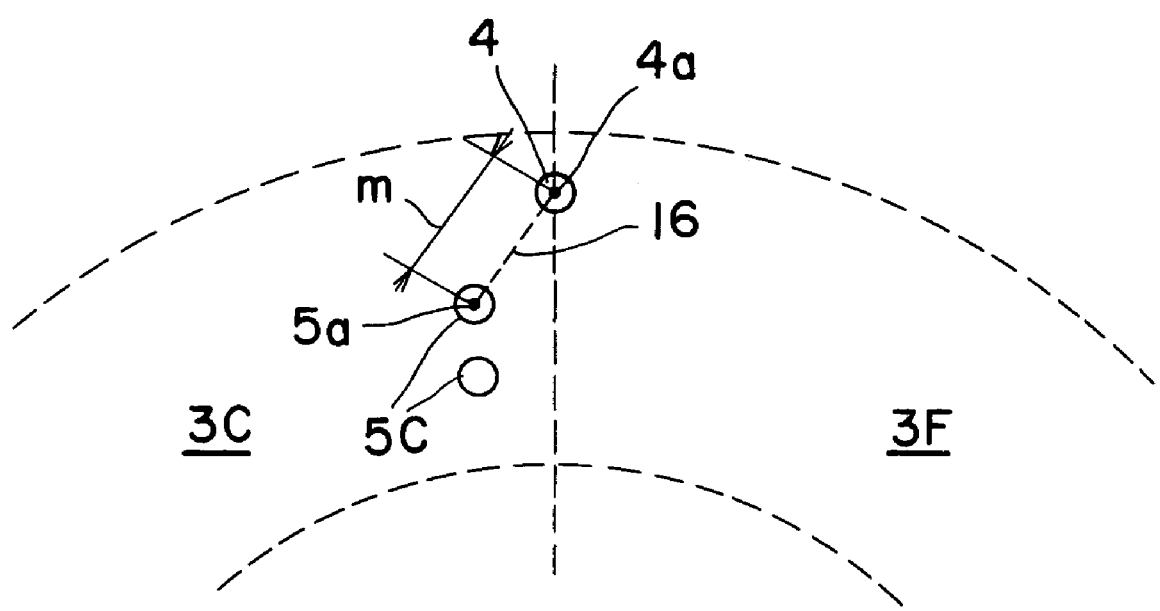
FIG. 5 is a diagram showing the relationship between the planar positions of the through holes 4 and terminals 5C according to a comparative example.

According to the present invention, the distance "n" between the terminal and through hole is at least 8 mm, and the resistance heater is provided between the center of the terminal and that of the through hole in a plan view. For example as shown in FIG. 4, the distance "n" between the outer surface 18 of the terminal 5C and the inner wall surface 17 defining the through hole 4 is at least 8 mm in a plan view showing the heating face. It is further designed that the resistance heater 15 intersects straight line 16 connecting the center 5a of the terminal 5C and the center 4a of the through hole 4 in a plan view showing the heating face. In other words, the resistance heater 15 intersects straight line 16 when the resistance heater 15 and straight line 16 are projected on the plane of the heating face. The advantages will be described below.

According to the present invention, the number of the resistance heaters to be controlled is increased to three or more for further improving temperature uniformity, so that heat generated from each zone is independently controlled. Finer control of the temperature distribution on the heating face can thus be realized. There has been a risk of fracture of the ceramic substrate due to thermal stress in the substrate in response to temperature distribution during a temperature ascending step. It has been speculated that such thermal stress and the in-plane temperature distribution can be reduced to prevent such fractures, by independently controlling power supply to the zones. It has been speculated that the fracture of the heater can be thus reduced.

When the number of the zones is increased, however, the number of the terminals is also increased corresponding to the number of resistance heaters in the zones. Referring now to FIG. 4, heat is not generated from the terminal 5C and through hole 4, so that the area available for heat generation is smaller to result in cold spot. If the distance "n" between the terminal and through hole is too small, however, it is impossible to provide a resistance heater required for generating heat between the terminal and through hole. It has been found that the distance "n" should be at least 8 mm for assuring insulating distance. If "n" is smaller than 8 mm, leak currents are observed in the ceramic material, which generate a hot spot, although the above-described cold spot can be prevented. If either a cold or a hot spot is generated on the heating face, however, the temperature uniformity is deteriorated, and the fracture of the heater might be induced. The formation of hot or cold spots should be thus prevented.

Hot spots can be prevented by increasing "n" to at least 8 mm. At the same time, the resistance heater 15 passes between the terminal and through hole, according to the invention, so that cold spots can also be prevented. It is thereby possible to improve temperature uniformity and to prevent the fracture of the substrate upon thermal cycles. If such resistance heaters are not provided, there would not be any heat source in the region including the terminal 5C and through hole 4 and cold spots would easily occur.

If the distance "n" between the terminal and through hole is too large, the proper design of the heater may become difficult. The distance "n" is preferably 290 mm or smaller on the viewpoint.

Further, only one hole for a device for measuring temperature is usually provided for each zone of the ceramic substrate where each resistance heater is embedded (the hole is not shown in FIG. 1). According to this design, however, temperature measuring devices such as thermocouples fixed in the holes in the different zones may affect each other, depending on the positions of the temperature measuring device holes and the influence of the environment of the chamber where the heater is actually used. It may become difficult to control the power supply to the resistance heater in each zone.

In a preferred embodiment, two or more holes for temperature measurement are provided in each zone. It is thus possible to better select the hole position to more effectively reduce the heat transfer among the zones, considering the environment in the chamber intended for use of the heater. The temperature measuring device is fixed in the selected hole so as to prevent device performance deterioration due to heat transfer among the zones and to improve the temperature uniformity on the heating face.

The ceramic material of the substrate for the heater is not particularly limited. The material for the substrate may be a known ceramic material including nitride ceramics such as aluminum nitride, silicon nitride, boron nitride and sialon, and alumina-silicon carbide composite materials. Aluminum nitride or alumina is most preferred for providing an excellent anti-corrosion property against corrosive gases such as halogen-based corrosive gases.

When a tubular supporting member is used, the supporting member is preferably made of aluminum nitride, silicon nitride, alumina or the like. A metal containing at least aluminum may be further used for the supporting member.

The shape of the substrate is not particularly limited and is preferably disk shaped. Pocket shaped parts, embossshaped parts, or grooves may be formed on the heating face.

The means for producing the substrate is not particularly limited, and the substrate is preferably produced by hot pressing or hot isostatic pressing.

The material for the resistance heater is preferably a metal having a high melting point such as tantalum, tungsten, molybdenum, platinum, rhenium, hafnium, nickel or the alloys of these metals. In particular, when the ceramic substrate is made of aluminum nitride, the material of the resistance heater is preferably pure molybdenum or an alloy containing molybdenum. The material of the resistance heater may be a conductive material such as carbon, TiN or TiC, in addition to the high melting point metals described above. The shape of the resistance heater may be a coil, ribbon, mesh, plate, film or the like.

The shape and material of terminal electrically connected with the resistance heater are not particularly limited, and may be the same as those of the resistance heater.

The application of the heater according to the present invention is not limited, and the heater is preferably used in a system for producing semiconductors. Such a system means a system that is usable in a wide variety of semiconductor processing in which metal contamination of a semiconductor is to be avoided. Such systems include film forming, etching, cleaning and testing systems.

The shape of each power supply means is not particularly limited, and may be a rod shaped body, a wire shaped body or a combination of rod and wire shaped bodies. The material for each power supply means is not particularly limited. The power supply means is separated from the atmosphere in the chamber by the tubular supporting member and thus is not directly exposed to any highly corrosive substance. The material of the power supply means is thus preferably a metal, and most preferably, nickel.

Elements for a high frequency electrode and an electrostatic chuck may be further embedded in the substrate.

The terminals may be electrically connected with the corresponding resistance heaters before being provided in the substrate. Alternatively, the heating terminals may be provided in the substrate before the resistance heaters are electrically connected to the terminals. The terminal and resistance heaters may be electrically connected with each other by means of a screw, caulking, fitting, soldering, welding, eutectic welding or the like.

The material for the member for supplying power from the outside of the ceramic substrate is preferably a metal, and more preferably, nickel. The terminal and member for supplying power are electrically connected with each other by means of a screw, caulking, fitting, soldering, welding, eutectic welding or the like.

The layout or planar pattern of the resistance heater in each zone is not particularly limited. For example, a plurality of ring-shaped zones may be positioned centrosymmetrically with respect to the center of the heating face. Further, each ring shaped zone may be divided into a plurality of arc shaped zones such as zones 3C, 3D, 3E and 3F shown in FIGS. 1 and 2. The angle of each arc shaped zone is not particularly limited.

EXAMPLES

Example 1

The heater 1A shown in FIGS. 1 and 2 was produced. The substrate 2 was made of an aluminum nitride sintered body having a diameter Φ of 340 mm and a thickness of 14 mm. Wound bodies made of molybdenum wires were embedded in the zones in the substrate as resistance heater. A cylindrical terminal made of molybdenum was used as the terminals and was mechanically connected to a molybdenum wire by caulking. The thus obtained ceramic substrate was processed to expose the surface of the molybdenum terminal. A cylindrical part 10 made of nickel was soldered to the exposed surface of the terminal as the power supply member.

The supporting member 11 was formed of an aluminum nitride sintered body and solid welded to the back face 2b of the substrate 2. A nickel rod was inserted into the inner space 12 of the supporting member 11 and electrically connected to each member 10.

Three through holes 4 for lift pins were formed in the ceramic substrate 2 at positions distant from the center of the substrate 2 by 280 mm and centrosymmetrical with respect to the center of the substrate 2. The diameter Φ of the holes for lift pin was 4 mm. One hole for a thermocouple was provided in each zone. The distance "n" between each terminal and the inner wall surface defining the through hole was at least 8 mm as shown in FIG. 4. The resistance heaters intersect the straight line 16 connecting the center of each terminal and the center of each through hole in a plan view. The resistance heater intersecting the straight line connecting one terminal and one through hole may also be electrically connected to the one terminal or another terminal different from the one terminal.

Example 2

The heater 1B having a planar pattern shown in FIG. 2 according to the substantially same procedure as Example 1, except that two thermocouple holes were formed in each zone. An appropriate hole was selected from the viewpoint of preventing the influence of heat transfer among the zones, so that thermocouples were fixed in the selected holes.

Comparative Example 1

A heater was produced according to substantially the same procedure as Example 1, except that the distance "n" between the terminal 5C and through hole 4 was made 7 mm and the resistance heater does not intersect the straight line 16 in a plan view.

Comparative Example 2

A heater was produced according to substantially the same procedure as Example 1, except that the distance "n" between the outer wall surface of the terminal and the inner wall surface defining the through hole 4 was made 7 mm. The resistance heater passed between the terminal and through hole.

Electric power was supplied to the above heaters and the temperature was measured by thermocouples fixed in the respective holes. The measured temperature values were used for feedback control of the power source, so that the temperature was adjusted to 700° C. The temperature distribution on the heating face (Δ T: the difference between the maximum and minimum temperatures on the heating face) was monitored. Further, a heat cycle test was performed between 200° C. and 700° C. to measure the number of heat cycles applied on the heater until fracture was observed in the heater. The results are shown in Table 1.

TABLE 1

|  | Temperature Distribution ΔT | Number of Cycles until fracture |
| --- | --- | --- |
| Inventive Example 1 | 3.2° C. | Not broken after 100 cycles |
| Inventive Example 2 | 2.5° C. | Not broken after 100 cycles |
| Comparative Example 1 | 12° C. | Not broken after 100 cycles |
| Comparative Example 2 | 36° C. | Broken after 82 cycles |

According to Examples 1 and 2, the temperature difference Δ T proved to be small and fracture was not observed in the heater until 100 heat cycles. In Example 2, more precise control can be realized so that the temperature difference Δ T is still further reduced. According to Comparative Example 1, although fracture was not observed until 100 heat cycles were applied on the heater, the temperature difference Δ T was elevated to 12° C. The increase of the temperature difference is due to a cold spot formed around the terminal and through holes. In Comparative Example 2, the temperature distribution was elevated to 36° C. and fracture was observed in the heater at 82 heat cycles. This is because "n" was made smaller and the resistance heater passed between the terminal and through hole to result in a leakage current causing a hot spot.

The present invention has been explained referring to the preferred embodiments. However, the present invention is not limited to the illustrated embodiments which are given by way of examples only, and may be carried out in various modes without departing from the scope of the invention.

The invention claimed is:

1. A ceramic heater comprising a ceramic substrate having a heating face including at least three independently controlled heating zones, a resistance heater corresponding to each of said zones, respectively, and terminals electrically connected to said resistance heaters, respectively;
    wherein said resistance heaters are respectively embedded in said ceramic substrate under said zones;
    wherein said terminals are respectively embedded in said ceramic substrate under said zones, and wherein at least a portion of each of said terminals is exposed to a back face of said ceramic substrate;
    wherein three or more through holes are formed in said ceramic substrate;
    wherein a distance between said terminals and wall surfaces of said ceramic substrate defining said through holes of said ceramic substrate are at least 8 mm, respectively; and
    wherein said resistance heater intersects a straight line connecting a center of one of said terminals that is closest to a respective one of said through holes and a center of said through hole when viewed in a plan view for each said through hole.

2. The ceramic heater of claim 1, wherein said ceramic substrate comprises aluminum nitride.

3. The ceramic heater of claim 1, wherein said resistance heaters comprise a metal comprising at least one of tungsten and molybdenum.

4. The ceramic heater of claim 1, wherein said ceramic heater further comprises a tubular supporting member fixed to said back face of said ceramic substrate, and wherein said exposed portions of said terminals are provided inside said supporting member.

5. The ceramic heater of claim 1, wherein said ceramic substrate includes at least two holes for fitting a temperature measuring device in each of said zones.

6. The ceramic heater of claim 1, wherein said at least three heating zones comprise a plurality of concentric, annular heating zones, wherein at least one of said concentric annular heating zones is radially divided to define a plurality of adjacent, partially annular heating zones.

* * * * *